(12) United States Patent
Chung et al.

(10) Patent No.: US 9,839,138 B2
(45) Date of Patent: *Dec. 5, 2017

(54) METHOD FOR FABRICATING BLACKENED CONDUCTIVE PATTERNS

(71) Applicant: Inktec Co., Ltd., Ansan-si, Kyeongki-do (KR)

(72) Inventors: Kwang Choon Chung, Yongin-si (KR); Ji Hoon Yoo, Bucheon-si (KR); Su-Han Kim, Ansan-si (KR); Byung Hun Kim, Ansan-si (KR)

(73) Assignee: Inktec Co., Ltd., Ansan-si, Kyeongki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/481,273

(22) Filed: Sep. 9, 2014

(65) Prior Publication Data

US 2014/0377455 A1 Dec. 25, 2014

Related U.S. Application Data

(63) Continuation of application No. 12/747,331, filed as application No. PCT/KR2008/007307 on Dec. 10, 2008, now Pat. No. 9,107,317.

(30) Foreign Application Priority Data

Dec. 11, 2007 (KR) .................. 10-2007-0128149

(51) Int. Cl.
*H05K 3/12* (2006.01)
*H05K 1/09* (2006.01)
*H05K 3/10* (2006.01)

(52) U.S. Cl.
CPC ........... *H05K 3/1258* (2013.01); *H05K 1/092* (2013.01); *H05K 3/107* (2013.01);
(Continued)

(58) Field of Classification Search
CPC .................. H05K 1/092; H05K 1/097; H05K 3/0026–3/0038; H05K 3/107;
(Continued)

(56) References Cited

U.S. PATENT DOCUMENTS 3,656,951 A * 4/1972 Anderson ............... G03F 7/038
430/271.1
4,705,357 A * 11/1987 Dietch .................... H01J 9/142
313/402

(Continued)

FOREIGN PATENT DOCUMENTS

JP  2000223886 A   8/2000
JP  2002314227 A   10/2002

(Continued)

OTHER PUBLICATIONS

Translation of JP 2002-314227 A by Mototsugu Shiga et al., published Oct. 25, 2002.*

(Continued)

*Primary Examiner* — Marianne L Padgett
(74) *Attorney, Agent, or Firm* — The Webb Law Firm

(57) ABSTRACT

The present invention relates to a method for fabricating blackened conductive patterns, which includes (i) forming a resist layer on a non-conductive substrate; (ii) forming fine pattern grooves in the resist layer using a laser beam; (iii) forming a mixture layer containing a conductive material and a blackening material in the fine pattern grooves; and (iv) removing the resist layer remained on the non-conductive substrate.

15 Claims, 5 Drawing Sheets

(52) U.S. Cl.
CPC ............. H05K 2201/09036 (2013.01); H05K 2203/0568 (2013.01); H05K 2203/072 (2013.01); H05K 2203/0723 (2013.01); H05K 2203/1126 (2013.01)

(58) Field of Classification Search
CPC ...... H05K 3/108; H05K 3/1208; H05K 3/125; H05K 3/1258; H05K 3/245–3/249; H05K 2203/107; H05K 2201/0112; H05K 2201/0376; C23C 18/1225; C23C 18/1605; C23C 18/165; C23C 18/1868; C23C 18/204; B23K 26/0087
USPC .... 427/554–558, 96.2, 97.1, 97.3–97.6, 259, 427/264, 265, 266, 270
See application file for complete search history.

(56) References Cited

U.S. PATENT DOCUMENTS

| | | | |
|---|---|---|---|
| 5,162,510 A * | 11/1992 | Potvin | G03F 7/022 430/165 |
| 5,462,897 A | 10/1995 | Baum et al. | |
| 6,458,509 B1 * | 10/2002 | Haruta | G03F 7/027 430/18 |
| 7,178,234 B2 * | 2/2007 | Kawasaki | H01L 23/49811 257/E23.067 |
| 7,220,682 B2 | 5/2007 | Hirai | |
| 7,514,203 B2 * | 4/2009 | Moon | G03F 7/0233 430/270.1 |
| 7,618,561 B2 | 11/2009 | Chung et al. | |
| 7,955,528 B2 | 6/2011 | Chung et al. | |
| 8,124,325 B2 | 2/2012 | Speakman | |
| 8,226,755 B2 | 7/2012 | Chung et al. | |
| 8,282,860 B2 | 10/2012 | Chung et al. | |
| 8,491,866 B2 | 7/2013 | Chung et al. | |
| 8,679,242 B2 * | 3/2014 | Chung | C07C 271/02 106/1.19 |
| 8,764,960 B2 * | 7/2014 | Chung | C25D 5/48 205/136 |
| 9,107,317 B2 * | 8/2015 | Chung | H05K 1/097 |
| 9,153,524 B2 * | 10/2015 | Suzuki | H01L 23/481 |
| 9,290,844 B2 * | 3/2016 | Chung | C09D 11/52 |
| 9,396,843 B2 * | 7/2016 | Chung | H01B 13/0036 |
| 9,457,406 B2 * | 10/2016 | Nakako | B22F 9/26 |
| 9,524,046 B2 * | 12/2016 | Chung | G06F 3/041 |
| 9,556,065 B2 * | 1/2017 | Cho | C03C 17/3405 |
| 9,671,542 B2 * | 6/2017 | Chung | G02B 5/3058 |
| 9,754,704 B2 * | 9/2017 | Markham | H01B 19/04 |
| 2002/0195916 A1 | 12/2002 | Marutsuka | |
| 2005/0003166 A1 | 1/2005 | Hirai | |
| 2005/0003640 A1 | 1/2005 | Ushiyama et al. | |
| 2005/0227158 A1 | 10/2005 | Yamauchi et al. | |
| 2006/0046474 A1 * | 3/2006 | Sugeno | H01L 51/0021 438/660 |
| 2006/0057502 A1 | 3/2006 | Okada et al. | |
| 2006/0063111 A1 * | 3/2006 | Ali | H05K 3/1258 430/322 |
| 2007/0034052 A1 * | 2/2007 | Vanheusden | B22F 1/0018 75/362 |
| 2007/0176150 A1 | 8/2007 | Chung et al. | |
| 2008/0055348 A1 * | 3/2008 | Deeter | B41J 3/4073 347/9 |
| 2008/0116615 A1 * | 5/2008 | Akimoto | H01J 9/02 264/400 |
| 2008/0210122 A1 * | 9/2008 | Magdassi | B41J 3/28 106/31.05 |
| 2010/0166948 A1 | 7/2010 | Cho et al. | |
| 2010/0189901 A1 | 7/2010 | Chung et al. | |
| 2010/0193912 A1 | 8/2010 | Speakman | |
| 2010/0247422 A1 | 9/2010 | Chung et al. | |
| 2010/0261031 A1 | 10/2010 | Chung et al. | |
| 2011/0247860 A1 | 10/2011 | Yoshioka et al. | |
| 2011/0318481 A1 | 12/2011 | Chung et al. | |
| 2013/0022761 A1 | 1/2013 | Chung et al. | |
| 2013/0056250 A1 | 3/2013 | Chung et al. | |
| 2013/0156684 A1 | 6/2013 | Chung et al. | |
| 2013/0206315 A1 | 8/2013 | Chung et al. | |
| 2013/0337188 A1 | 12/2013 | Konno et al. | |
| 2014/0106492 A1 | 4/2014 | Chung et al. | |
| 2014/0179944 A1 | 6/2014 | Chung et al. | |
| 2014/0306382 A1 | 10/2014 | Cok | |
| 2014/0377455 A1 | 12/2014 | Chung et al. | |
| 2015/0000125 A1 | 1/2015 | Chung et al. | |
| 2015/0068787 A1 | 3/2015 | Chung et al. | |
| 2016/0132141 A1 * | 5/2016 | Chung | G06F 3/041 216/18 |
| 2016/0202404 A1 * | 7/2016 | Chung | G02B 5/3058 216/18 |
| 2017/0194241 A1 * | 7/2017 | Liu | H01L 23/49838 |

FOREIGN PATENT DOCUMENTS

| | | | | |
|---|---|---|---|---|
| JP | 2003198185 A | 7/2003 | | |
| JP | 2004281738 A | 10/2004 | | |
| JP | 200513984 A | 1/2005 | | |
| JP | 2005057026 A | 3/2005 | | |
| JP | 2005300681 A | 10/2005 | | |
| JP | 2006222295 A | 8/2006 | | |
| JP | 2006278617 A | 10/2006 | | |
| JP | 2007-171973 A | * | 7/2007 | ............. G03F 7/033 |
| KR | 102006009180 A | 10/2006 | | |
| KR | 1020070044109 A | 4/2007 | | |
| KR | 1020080013787 A | 2/2008 | | |
| WO | WO 2005/019360 A1 | * | 3/2005 | ............... B41J 3/28 |
| WO | 2006093398 A1 | 9/2006 | | |
| WO | 2006121298 A1 | 11/2006 | | |

OTHER PUBLICATIONS

Translation of KR 10-20070044109 A, by Seongil Oh et al., published Oct. 24, 2005.*
Webster's Ninth New Collegiate Dictionary; Merriam-Webster incorporated, publishers; Springfield, Massachusetts, USA; 1990 (no month); excerpt p. 494.*
Richard J Lewis, Sr., editor; Hawley's Condensed Chemical Dictionary, 12th edition;Van Nostrand Reinhold company, New York; 1993 (no month); excerpt pp. 5,18-19,35, 541,555, & 749-750.*
Webster's Nine New Collegiate Dictionary; Merriam-Webster incorporated, publishers; Springfield, Massachusetts, USA; 1990 (no month); excerpt p. 606.*
Julius Grant, editor; Hackh's Chemical Dictionary; third edition; McGraw-Hill Book Company, incorporated; New York; 1944 (no month); excerpts pp. 150 & 680.*
Lewis, Sr., editor; Hawley's Condensed Chemical Dictionary; 12th edition; Van Nostrand Reinhold company, New York; 1993 (no month), excerpt pp. 63-71.

* cited by examiner

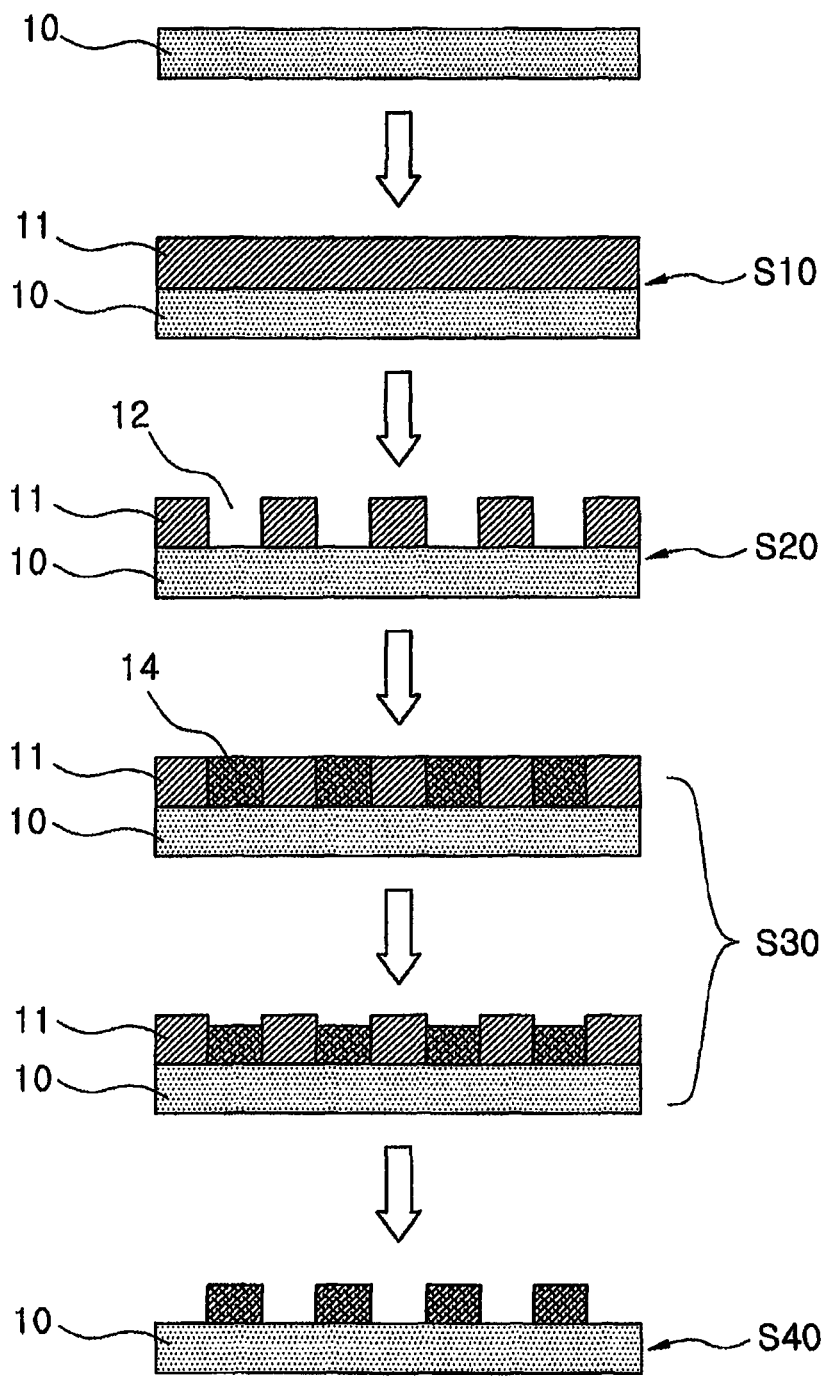

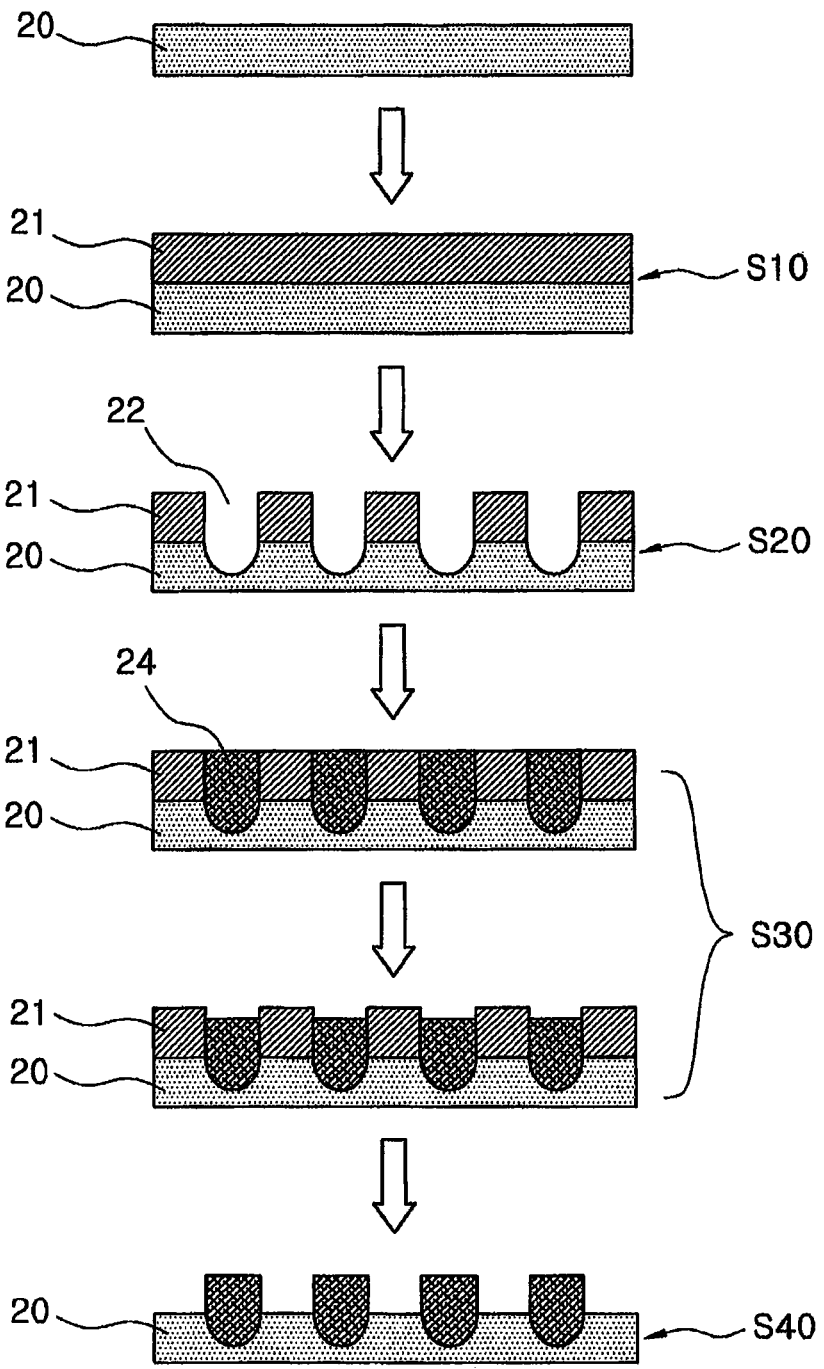

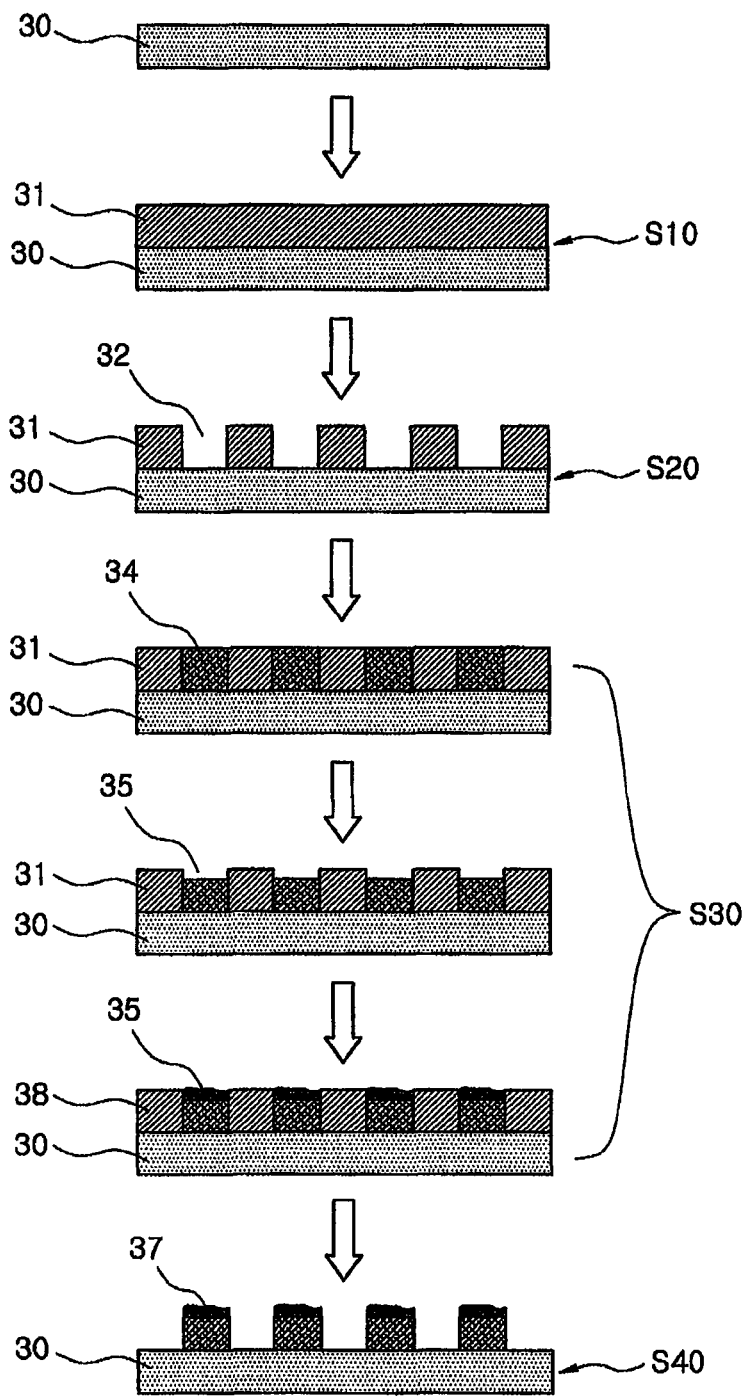

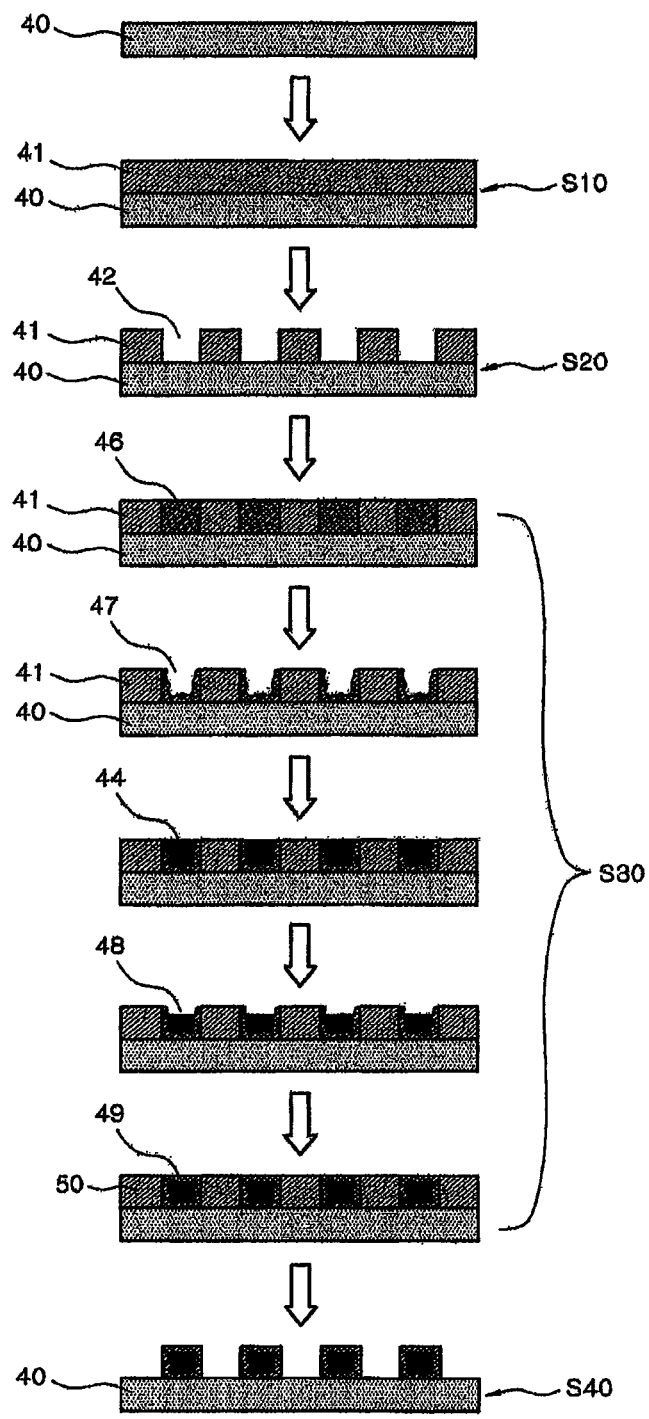

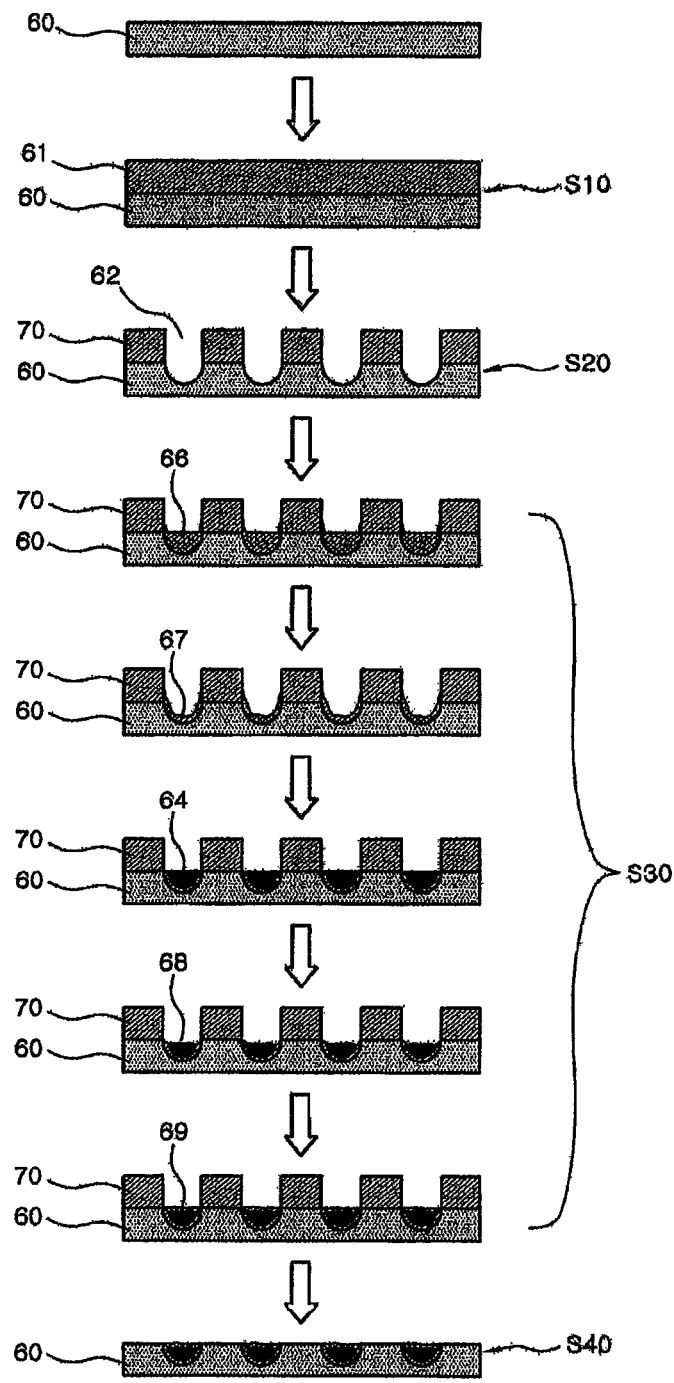
[Figure 5]

METHOD FOR FABRICATING BLACKENED CONDUCTIVE PATTERNS

CROSS REFERENCE TO RELATED APPLICATIONS

This application is a continuation of U.S. patent application Ser. No. 12/747,331, filed Sep. 20, 2010, entitled "Method for Fabricating Blackened Conductive Patterns", which is the United States National Phase of International Patent Application No. PCT/KR2008/007307, filed Dec. 10, 2008, which claims the priority of Korean Patent Application No. 10-2007-0128149, filed Dec. 11, 2007, each of which is hereby incorporated by reference herein in its entirety.

TECHNICAL FIELD

The present invention relates to a method for fabricating blackened conductive patterns, and more particularly, to a method for fabricating blackened conductive patterns in which a resist layer is formed on a non-conductive substrate using polymer material, fine pattern grooves are formed on the resist layer using a laser beam and then, the blackened conductive patterns are formed in the fine pattern grooves.

BACKGROUND ART

Blackening is generally used, for the purpose of increasing visibility, as a method for roughening (diffusion of light) or blackening (absorption of light) a surface of a metal layer by treating with acid or alkali or by plating to eliminate scattered reflection of light and raise light absorption. For example, if a blackened layer is formed on a metal mesh for shielding electromagnetic wave generated from a PDP, reflection of light from the electromagnetic shielding metal is inhibited and an image on the display can be therefore seen with high contrast.

Currently commercialized methods of forming blackened conductive patterns can be representatively divided into a photolithographic method and a screen printing method. In the photolithographic method, a flexible base film made by pressing a thin plate of conductive material onto a polyethylene (PE) or polyester (PET) film is used. In order to form a pattern circuit, a dry film or a photoresist solution is coated on the surface of the conductive material and a film to be realized to the circuit is compacted onto the dry film or photoresist solution coated layer, followed by UV irradiation, thereby transferring the circuit. After development using a developing solution, unnecessary conductive thin plate is etched using a chemical etching solution with the circuit to be realized alone being remained, and the dry film or coated photoresist solution compacted on the surface of the circuit is then removed to fabricate patterns. The resulting conductive patterns are brought into contact with blackening material to form blackened conductive patterns.

However, the aforementioned conventional photolithography method has problems that the fabrication process is complex and winding, crumpling or tearing may be generated due to an adhesive layer used for the film during transporting process of the fabrication. Also, high cost and large sized equipments are required according to the etching process and environmental problem may be caused during disposal of the etching solution.

In the screen printing, another method of forming and blackening conductive patterns, a conductive paste is screen printed to form conductive patterns and thereon blackening material is formed or a conductive paste containing the blackening material is screen printed, thereby forming the blackened conductive patterns. The method of conductive patterns by the screen printing has simple processes, but represents limitation to form high resolution patterns of below 30 um and large area patterns and also has problems of high cost equipment and low productivity.

In recent, in order to form the high resolution patterns of below 30 um, there has been studied a method using a laser.

Japanese Patent Publication No. 2002-314227 discloses a method for manufacturing a ceramic circuit board, in which holes corresponding to conductive patterns is formed on a film adhered to a green sheet by laser processing, a conductive paste is filled in the through hole and thereafter the film adhered to the green sheet is removed, thereby forming thin fine conductive patterns. Japanese Patent Publication No. 2004-281738 discloses a method for drawing conductive wire patterns by adhering a conductive paste to a substrate through laser scanning, in which the surface of a the substrate on which a conductive paste is coated is scanned by laser beams to form conductive wire patters by curing the conductive paste and thereafter the portion of the conductive paste excluding the portion scanned by the laser beams is solved by an organic solvent to removed the same and the portion scanned by the laser beams is then calcined to draw conductive the wire patterns on the substrate.

Japanese Patent Publication No. 2006-222295 discloses a method for ultrafine wiring board on which ultrafine wirings are formed, in which a photoresist resin formed on a board is subject to an interference exposure by irradiating a laser beam, followed by development, and thereafter, a solution containing conductive material is filled in the bottom of the groove portion and sintered, thereby forming ultrafine wirings.

Also, US Patent Publication No. 20060057502 discloses a conductive wiring pattern by laser irradiation, in which a board is applied with metal dispersion colloid including metal nanoparticles of 0.5 nm-200 nm diameters, a dispersion agent and a solvent, partially irradiated by a laser beam of 300 nm-550 nm wavelengths to sinter the metal nanoparticles and then washed to eliminate metal dispersion colloid on the portion not irradiated by the laser beam, thereby forming the conductive circuit corresponding to the shape irradiated by the laser beam.

Although various methods of forming fine patterns using a laser are disclosed as described above, a method of forming blackened fine patterns has not yet been disclosed.

DISCLOSURE

Technical Problem

The present inventors have achieved the present invention as the result of constant studies for solving the various problems in the conventional method of blackening conductive patterns.

An object of the present invention is to provide a method for fabricating blackened conductive pattern, in which fabrication process is simple and economic, an environmental problem due to disposal of an etching solution is not generated and fine blackened conductive patterns with high resolution and superior conductivity and blackened degree can be fabricated.

Technical Solution

The present invention according to the present invention is characterized by forming the blackened conductive pattern by forming a resist layer using polymer material, forming fine pattern grooves using a laser beam, a mixture layer containing conductive material and blackening material in the fine grooves and removing the resist layer.

A method for fabricating blackened conductive pattern according to the present invention includes (i) forming a resist layer on a non-conductive substrate (S10); (ii) forming fine pattern grooves in the resist layer using a laser beam (S20); (iii) forming a mixture layer containing a conductive material and a blackening material in the fine pattern grooves (S30); and (iv) removing the resist layer remained on the non-conductive substrate (S40).

Hereinafter, the present invention will be described in more detail by the steps.

Step (i): Forming a Resist Layer on a Non-Conductive Substrate

Examples usable for the non-conductive substrate may include a glass board or a plastic film made of polyimide (PI), polyethylene terephthalate (PET), polyethylene naphthalate (PEN), polyethersulfone (PES), Nylon, polytetrafluoroethylene (PTFE), polyetheretherketone (PEEK), polycarbonate (PC) or polyarylate (PAR), but not limited thereto. The substrate may be selectively used to meet the properties of the substrate according to a heat treating temperature which will be described later.

The material for forming the resist layer is preferred to be readily vaporized or decomposed by a laser beam and not to dissolve the conductive material. The usable material is an organic polymer material and examples for the an organic polymer material may include polypropylene, polycarbonate, polyacrylate, polymethylmethacrylate, cellulose acetate, polyvinyl chloride, polyurethane, polyester, alkyd resin, epoxy resin, melamine resin, phenol resin, phenol modified alkyd resin, epoxy modified alkyd resin, vinyl modified alkyd resin, silicone modified alkyd resin, acrylic melamine resin, polyisocyanate resin and epoxy ester resin, but not particularly limited thereto, provided that the object of the present invention can be achieved.

As the method of forming the resist layer on the non-conductive substrate, a known conventional method of forming a layer may be used, but the method is not particularly limited, provided that the object of the present invention can be achieved. For example, spin coating, roll coating, spray coating, dip coating, flow coating, doctor blade and dispensing, inkjet printing, offset printing, screen printing, pad printing, gravure printing, flexography printing, stencil printing, imprinting or the like may be used.

Also, a solvent may be used to form the resist layer to a uniform thin film. Examples for the solvent may include alcohols such as ethanol, isopropanol and butanol, glycols such as ethylene glycol and glycerine, acetates such as ethyl acetate, butyl acetate, methoxypropyl acetate, carbitol acetate and ethylcarbitol acetate, ethers such as methyl cellosolve, butyl cellosolve, diethyl ether, tetrahydrofuran and dioxane, ketones such as methyl ethyl ketone, acetone, dimethylformaldehyde and 1-methyl-2-pyrrolidone, hydrocarbons such as hexane, heptane, dodecane, paraffin oil and mineral spirit, aromatic hydrocarbons such as benzene, toluene and xylene, halogen substituted solvent such as chloroform, methylene chloride and carbon tetrachloride, acetonitrile, dimethyl sulfoxide or a mixture thereof.

The resist layer is formed to a thickness of below 50 μm, preferably 1 μm to 25 μm. The thickness of the resist layer is required to be controlled according to the condition for the formation of single layer patterns or multilayer patterns.

Upon the formation of the resist layer, dry may be performed at a temperature range in which the non-conductive substrate is not deformed, preferably at 80 to 400° C.

Step (ii): Forming Fine Pattern Grooves in the Resist Layer

A method of forming fine pattern grooves in the state that the resist layer is formed on the non-conductive layer with a uniform thickness is to utilize a laser beam having energy enough to vaporize or decompose the material of the resist layer. When using the laser beam, it is possible to form a fine circuit with high resolution. It is also possible to vaporize or decompose some of the substrate other than the resist layer.

In the present invention, it is possible to realize the resolution of the fine patterns to a minimum critical dimension which can be directly patterned by a laser beam. The minimum critical dimension may be sub-micrometer and the maximum critical dimension may be hundreds to thousands micrometers according to a laser equipment. Also, it is possible to a height of the fine pattern groove by controlling the output energy of the laser beam. It is possible to control the height of the fine pattern groove from minimally sub-micrometer to maximally over the thickness of the resist layer to the thickness of the non-conductive substrate. In addition, it is possible to control the height of the fine pattern groove and a thickness of the blackened conductive pattern finally formed in the following step according to a method of forming and blackening the conductive patterns. Furthermore, it is possible to form the fine patterns partially using an optical diffraction element or a mask in order to control the shape of the beam advantageously to the patterning upon the use of the laser beam.

Step (iii): Forming a Mixture Layer Containing a Conductive Material and a Blackening Material in the Fine Pattern Grooves The mixture layer containing the conductive material and the blackening material may be a single layer in which the conductive material and the blackening material are mixed, a stacked layer in which a conductive layer containing the conductive material and a blackened layer containing the blackening material are stacked in turn or a mixture layer structured so that the blackened layer surrounds the conductive layer.

The method of forming the mixture layer will be described in detail.

First, the mixture layer may be formed by filling a conductive ink containing the blackening material and the conductive material in the fine pattern grooves.

Second, the mixture layer may be formed by forming a conductive layer by filling and drying a conductive ink containing the conductive material in the fine pattern grooves and forming an upper blackened layer on the conductive layer.

Third, the mixture layer may be formed by forming a lower blackened layer by filling and drying a blackening solution containing the blackening material in the fine pattern grooves, forming a conductive layer by filling and drying a conductive ink containing the conductive material in the fine pattern grooves formed with the lower blackened layer, and forming an upper blackened layer on the conductive layer. The mixture layer may have a structure in that the conductive layer is surrounded by the lower blackened layer and the upper blackened layer.

The upper blackened layer formed on the conductive layer may be formed by filling the blackening solution containing the blackening material in the fine pattern groove formed with the conductive layer and drying the blackening solution, by electroplating or electroless plating the blackening material on the conductive layer or by dipping the conductive layer formed in the fine pattern grooves in a blackening solution containing the blackening material to blacken the surface of the conductive layer.

The conductive material is not particularly limited and includes generally used material. For example, silver, gold, platinum, palladium, copper, nickel, zinc, iron, aluminum or a mixture thereof may be used.

Also, the shape of the conductive material may be spherical, linear, platy or a mixed shape thereof and may be used in various forms including particles, powder, flakes, colloid, hybrid, paste, sol, solution which include nanoparticles, or a mixture of at least two thereof.

The present inventors had applied a method for preparing silver nanoparticles by reducing silver complex with a specific structure as Korean Patent Application No. 2006-0074246. The conductive material according to the present invention may contain the silver nanoparticles prepared by the above Patent Application. The silver nanoparticles disclosed in the above Patent Application have advantages of uniform particle size and minimized cohesion and a conductive ink including the silver nanoparticles has an advantage that it is possible to readily form uniform and dense thin film or fine pattern even when the ink has been calcined for a short time at a low temperature of below 150° C. In the present invention, advantages of easy formation of the conductive patterns and superior physical properties of the formed patterns are resulted when the conductive material according to the present invention includes the silver nanoparticles prepared by the following fabrication method as described in the above Patent Application:

a) forming a silver complex by reacting a silver compound represented by the formula 1 below with one or a mixture of two or more selected from the group consisting of ammonium carbamate-based compound, ammonium carbonate-based compound and ammonium bicarbonate-based compound represented by the formula 2 to 4 below; and b) preparing silver nanoparticles by reducing or thermally decomposing the silver complex prepared in the step a) by reacting the silver complex with a reducing agent or applying heat to the silver complex,

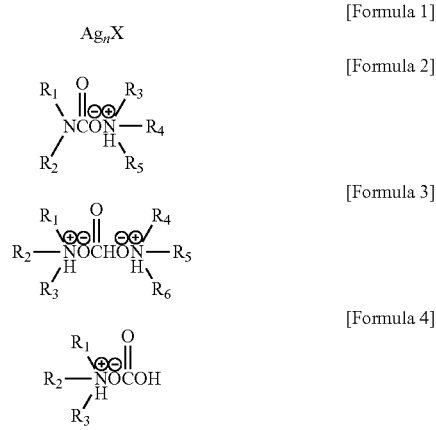

[Formula 1]
[Formula 2]
[Formula 3]
[Formula 4]

wherein, in the formulas 1 to 4, X is a substituent selected from the group consisting of oxygen, sulfur, halogen, cyano, cyanate, carbonate, nitrate, nitrite, sulfate, phosphate, thiocyanate, chlorate, perchlorate, tetrafluoroborate, acetylacetonate, carboxylate and derivatives thereof, n is an integer from 1 to 4, and $R_1$ to $R_6$ are independently selected from the group consisting of hydrogen, hydroxyl group, $C_1$-$C_{30}$ alkoxy group, $C_3$-$C_{20}$ aryloxy group, $C_1$-$C_{30}$ aliphatic or $C_3$-$C_{20}$ cycloaliphatic alkyl group or $C_3$-$C_{20}$ aryl or $C_4$-$C_{30}$ aralkyl group as a mixture thereof, substituted $C_1$-$C_{30}$ alkyl group, substituted $C_1$-$C_{20}$ aryl group, substituted $C_4$-$C_{30}$ aralkyl group, $C_3$-$C_{20}$ heterocyclic compound including a heteroatom selected from the group consisting of N, S, O, polymer compound and derivatives thereof, wherein when $R_1$ to $R_6$ are substituted or unsubstituted alkyl group or aralkyl group, alkyl group or aralkyl group may contain a heteroatom selected from the group consisting of N, S, O or an unsaturated bond in the carbon chain, wherein $R_1$ and $R_2$ or $R_4$ and $R_5$, independently, may form an alkylene ring containing or not containing a heteroatom.

Examples for the substituted functional group may include, but not limited to, $C_1$-$C_{30}$ alkoxy group, carboxyl group, tri($C_1$-$C_7$)alkoxysilyl group, hydroxyl group and cyano group.

Specific examples for the compound of the formula 1 are, but not limited to, silver oxide, silver thiocyanate, silver sulfide, silver chloride, silver cyanide, silver cyanate, silver carbonate, silver nitrate, silver nitrite, silver sulfate, silver phosphate, silver perchlorate, silver tetrafluoroborate, silver acetylacetonate, silver acetate, silver lactate, silver oxalate or a derivative thereof.

Also, specific examples for the substituents $R_1$ to $R_6$ of the formulas 2 to 4 may be selected from, but not particularly limited to, the group consisting of hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, allyl, hydroxy, methoxy, hydroxyethyl, methoxyethyl, 2-hydroxypropyl, methoxypropyl, cyanoethyl, ethoxy, butoxy, hexyloxy, methoxyethoxyethyl, methoxyethoxyethoxyethyl, hexamethyleneimine, morpholine, piperidine, piperazine, ethylenediamine, propylenediamine, hexamethylenediamine, triethylenediamine, pyrrole, imidazole, pyridine, carboxymethyl, trimethoxysilylpropyl, triethoxysilylpropyl, phenyl, methoxyphenyl, cyanophenyl, phenoxy, tolyl, benzyl and a derivative thereof, a polymer compound such as polyallylamine and polyethyleneimine and a derivative thereof.

In specific examples for the compound, the ammonium carbamate-based compound represented by the formula 2 may be one or a mixture of two or more selected from the group consisting of ammonium carbamate, ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneiminium hexamethyleneiminecarbamate, morpholinium morpholinecarbamate, pyridinium ethylhexylcarbamate, triethylenediaminium isopropylbicarbamate, benzylammonium benzylcarbamate, triethoxysilylpropylammonium triethoxysilylpropylcarbamate and a derivative thereof. The ammonium carbonate-based compound represented by the formula 3 may be may be one or a mixture of two or more selected from the group consisting of ammonium carbonate, ethylammonium ethylcarbonate, isopropylammonium isopropylcarbonate, n-butylammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneiminium hexamethyleneiminecarbonate, morpholinium morpholinecarbonate, benzylammonium benzylcarbonate, triethoxysilylpropylammonium triethoxysilylpropylcarbonate, triethylenediaminium isopropylcarbonate and a derivative thereof. The ammonium bicarbonate-based compound represented by the formula 4 may be may be one or a mixture of two or more selected from the group consisting of ammonium bicarbonate, isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridinium bicarbonate, triethylenediaminium bicarbonate and a derivative thereof.

The conductive ink containing conductive material according to the present invention contains at least one conductive material and may include, if necessary, additives such as a solvent, a stabilizer, a dispersant, a binder resin, a reducing agent, a glass frit, a surfactant, a wetting agent, a thixotropic agent and a leveling agent.

The drying temperature of the conductive ink is generally 100 to 300° C., preferably 100 to 200° C., which is good for physical properties of the thin film. Calcination may be performed when forming the mixture layer or the conductive layer. But, it is preferred to perform the calcination process in the step of removing the resist layer because the calcinations of the mixture layer and the removal of the remained resist layer can be performed at the same time. A filling thickness of the conductive material is determined by the content of solids after volatilization of the solvent in the conductive ink. The filling thickness of the conductive material is preferably 1 to 80% of a thickness of the fine patterns and more preferably 10 to 70%.

The blackening material according to the present invention is used for enhancing a blackened degree of the conductive patterns and may be a metal oxide, a metal sulfide or an organic metal compound containing one or more than two metal(s) selected from the group consisting of Cu, Zn, Ni, Co, Ti, Mn, Fe, Cr, Nb, Ru, Cd, Ge and Sn. Specific examples may be cobalt oxide, chromium oxide, titanium oxide, ruthenium oxide, cobalt stearate, nickel naphthalate, cobalt naphthalate, copper 2-ethylhexanoate, tin 2-ethylhexanoate, cobalt hydroxy neodecanoate, iron stearate, nickel formate, calcium naphthenate, zinc citrate, barium neodecanoate or a mixture of one or more than two thereof. In the step of forming the mixture layer, a blackening solution containing the blackening material is used. The blackening solution contains a solvent in addition to the blackening material and may further contain, if necessary, additives such as a stabilizer, a dispersant, a binder resin, a reducing agent, a surfactant, a glass frit, a wetting agent, a thixotropic agent and a leveling agent.

As the method of filling the conductive ink or the blackening solution in the fine pattern grooves upon the formation of the mixture layer according to the present invention, a known conventional method of forming a layer may be used, but the method is not particularly limited, provided that the object of the present invention can be achieved. For example, spin coating, roll coating, spray coating, dip coating, flow coating, doctor blade and dispensing, inkjet printing, offset printing, screen printing, pad printing, gravure printing, flexography printing, stencil printing, imprinting or the like may be used. Also, it is possible to blacken the conductive patterns not only by the formation of single layer patterns but also by the formation of multilayer patterns.

When the solvent contained in the blackening solution is volatilized after filling the blackening solution, the filling thickness of the blackened layer is determined according the content of the solids. The thickness of the blackened layer in the fine pattern grooves is preferably 1 to 50% of the thickness of the fine patterns and more preferably 1 to 30%.

The dry after filling the blackening solution may be performed at any temperature provided that there is no deformation of the polymer material in the resist layer.

As described above, in the mixture layer containing the conductive material and the blackening material, after the lower blackened layer is formed by the blackening solution, the fine pattern grooves are filled with the conductive ink, followed by drying the conductive ink, and then filled again with the blackening solution to form the upper blackened layer, thereby completing formation and blackening of the conductive patterns. In another example, the fine pattern grooves are sequentially filled with the blackening solution which can raise the blackened degree and the conductive solution and then heat treated, followed by formation of the blackened surface layer using electroplating or electroless plating, thereby capable of forming the blackened conductive pattern.

Detailed description will be followed with reference to accompanying drawings.

Step (iv): Removing the Resist Layer Remained on the Non-Conductive Substrate

By removing the resist layer remained on the substrate after forming the mixture layer containing the conductive material and the blackening material, it is possible to remove the conductive material or the blackening material, which is remained in an unnecessary portion on the resist layer, together.

In the present invention, the resist layer can be removed by using a solvent if the material of the resist layer can be dissolved by a suitable solvent, or by heat treatment for certain time and following simple washing using a solvent if the material of the resist layer can be vaporized or thermally decomposed by heat.

The heat treatment is preferably performed at a temperature of 300 to 650° C. and more preferably at a temperature of 500 to 650° C. for the clear removal of the resist layer. During the heat treatment, calcination of the conductive material present in a dry state can be performed at the same time.

DESCRIPTION OF DRAWINGS

The above and other objects, features and advantages of the present invention will become apparent from the following description of preferred embodiments given in conjunction with the accompanying drawings, in which:

FIG. 1 illustrates the process step of fabricating blackened conductive patterns related to Example 1 of the present invention;

FIG. 2 illustrates the process step of fabricating blackened conductive patterns related to Example 2 of the present invention;

FIG. 3 illustrates the process step of fabricating blackened conductive patterns related to Example 3 of the present invention;

FIG. 4 illustrates the process step of fabricating blackened conductive patterns related to Examples 4 to 8 of the present invention; and FIG. 5 illustrates the process step of fabricating blackened conductive patterns according to further another embodiment of the present invention, in which there is no height difference between the blackened conductive patterns and a substrate.

DETAILED DESCRIPTION OF MAIN ELEMENTS 10, 20, 30, 40, 60: substrate
11, 21, 31, 41, 61: resist layer
12, 22, 32, 42, 62: fine pattern groove
14, 24: blackening conductive ink
34, 44, 64: conductive ink
36, 46, 66: blackening solution
37, 49, 69: upper blackened layer
47, 67: lower blackened layer
15, 25, 38, 50, 70: residual resist layer

BEST MODE

Hereinafter, a method for fabricating blackened conductive patterns according to the present invention will be described in detail with reference to accompanying drawings.

FIGS. 1 and 2 illustrate the process step of forming blackened conductive patterns using a blackening conductive ink in which a blackening solution and a conductive ink are mixed. A resist layer 11 is formed on a non-conductive substrate 10 and irradiated by a UV laser to form fine pattern grooves 12. Subsequently, a blackening conductive ink 14 is filled in the fine pattern grooves 12 and dried, followed by heat treatment to remove the resist layer 15 remained on the non-conductive substrate 10 and calcine the conductive ink at the same time, thereby forming blackened conductive patterns.

Herein the drying process for and calcination process for the conductive ink 14 may be performed at the same time.

Meanwhile, in the fabrication method shown in FIG. 2, the resist layer is removed with the fine patterns and, at the same time, the substrate 20 is also removed by a predetermined depth during the process of forming the fine pattern grooves 12 by irradiating the UV laser. Consequently, it is possible to enhance the adhesion between the conductive patterns and the substrate.

FIG. 3 illustrates the process step of fabricating blackened conductive patterns according to another embodiment of the present invention, in which a conductive ink and a blackening solution are sequentially filled to form the blackened conductive patterns. A resist layer 31 is formed on a non-conductive substrate 30 and irradiated by a UV laser to form fine pattern grooves 32. Subsequently, a conductive ink 34 is filled in the fine pattern grooves 32 and dried. Then, the solvent contained in the conductive ink is volatilized to reduce a thickness of the conductive pattern layer, thereby forming a predetermined space 35 in the fine pattern grooves.

In the space 35, a blackening solution 36 is filled and dried to form an upper blackened layer 37, followed by heat treatment to remove the resist layer 38 remained on the non-conductive substrate 30 and calcine the conductive ink at the same time, thereby forming blackened conductive patterns.

FIG. 4 illustrates the process step of fabricating blackened conductive patterns according to further another embodiment of the present invention, in which a conductive ink and a blackening solution are sequentially filled to form the blackened conductive patterns. A resist layer 41 is formed on a non-conductive substrate 40 and irradiated by a UV laser to form fine pattern grooves 42. A blackening solution 46 is filled in the fine pattern grooves 42 and dried to form a blackened layer (a lower blackened layer 47) inside the fine pattern grooves by volatilization of a solvent contained in the blackening solution. Subsequently, a conductive ink 44 is filled in the fine pattern grooves 42 and dried. Then, the solvent contained in the conductive ink is volatilized to reduce a thickness of the conductive pattern layer, thereby forming a predetermined space 48 in the fine pattern grooves.

In the space 48, the blackening solution is filled and dried to form a blackened layer (an upper blackened layer 47), followed by heat treatment to remove the resist layer 50 remained on the non-conductive substrate 40 and calcine the conductive ink at the same time, thereby forming blackened conductive patterns. While the upper blackened layer can be formed by the layer formation method as described above, it is possible to form the upper blackened layer by electroplating or electroless plating in a blackening metal solution or dipping in a blackening solution.

Meanwhile, in the fabrication method shown in FIG. 5, during the process of forming the fine pattern grooves 62 by irradiating the UV laser, the resist layer is removed with the fine patterns and, at the same time, the substrate 60 is also removed by a predetermined depth, wherein the depth of the removed substrate is controlled equal to the height of the mixture layer containing the conductive material and the blackening material which is formed in the subsequent step.

Consequently, it is possible to enhance the adhesion between the conductive patterns and the substrate. In addition, it is also possible to form even blackened conductive patterns having no height difference from the surface of the substrate since the blackened conductive pattern layer is formed in a damascene manner.

[Preparation Example 1] Preparation of Silver Complex

Into a 250 ml Schlenk flask equipped with a stirrer, 34.89 g (129.8 mmol) of viscous liquid in which 2-ethylhexylammonium 2-ethylhexylcarbamate and butylammonium butylcarbamate are mixed at a molar ratio of 7:3 was put and 12.03 g (51.92 mmol) of silver oxide (made by Aldrich Chemical Co.) was added, followed by the reaction at room temperature for two hours with stirring. The reaction solution was initially a black slurry, but it turned transparent as complex was produced. Finally, 46.92 g of yellow, transparent aqueous silver complex was obtained and the silver complex had a viscosity of 7.8 pa·s and a silver content of 23.65 wt % (TGA analysis)

[Preparation Example 2] Preparation of Silver Nanoparticles

Into a 100 ml beaker, 40.0 g of the silver complex prepared in Preparation Example 1 and 23.1 g of isopropyl alcohol were added and stirred at room temperature for ten minutes to prepare a first solution. Into another 100 ml beaker, 1.2 g of hydrazine monohydrate (made by Daejung Chemicals and Metals Co. Ltd.) and 50 g of isopropyl alcohol were added to prepare a second solution. The first solution and the second solution were injected into their inlets with a flow rate of 20 g/min, respectively. The solutions injected through the inlets were reacted at 5,000 rpm using a stirrer (made by Silverthorne, product name:

L4RT-A) to obtain dark green slurry. The prepared slurry was filtered with a 1.2 um filter (made by Wattman company, product name: GF/C) by natural precipitation, followed by washing three times with isopropyl alcohol to obtain green nonopowder.

[Preparation Example 3] Preparation of Conductive Ink

To 1.2 g of terpineol (made by TCI) as a solvent having a high boiling point, 40.0 g of the silver complex prepared by the same manner as described in Preparation Example 1 and 40 g of the green nanopowder prepared by the same manner as described in Preparation Example 2 were added and stirred for ten minutes, followed by adding 1.2 g of 1-amino-2-propanol (made by Aldrich Chemical Co.) and stirring again for tem minutes. After that, the resultant was passed through a three roll mill (made by Drais Manheim) three times to prepare a conductive ink composition having a silver content of 59.93 wt %.

[Preparation Example 4] Preparation of Blackening Solution

To 46.5 g of terpineol (made by TCI) as a solvent having a high boiling point, 12 g of cobalt oxide (made by Junsei)), 30 g of glass frit (made by Daion), 1.5 g of EFKA 4300 (made by EFKA) and 10 g of BR18 (made by Wacker) were added and stirred for ten minutes. After that, the resultant was passed through a three roll mill (Drais Manheim) three times to prepare a blackening solution composition.

Example 1

3 g of acryl resin (E 2823, made by Elvacite) was dissolved in 1 g of toluene and 0.2 g of butyl acetate to prepare an ink for screen printing of a resist layer. The ink was screen printed onto a glass substrate to form a resist layer pattern having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the conductive ink composition prepared in Preparation Example 3 and the blackening solution composition prepared in Preparation Example 4 were mixed with a weight ratio of 8:2 and filled in the fine pattern using screen printing followed by drying at 150 for two minutes. A thickness of the blackened conductive patterns was 5 micrometers. After that, calcination was performed at 600° C. to remove the residual resist layer material, thereby capable of obtaining blackened conductive fine patterns.

Example 2

Blackened conductive fine patterns were obtained by the same manner as in Example 1 except that the groove was formed passing through the resist layer into the glass substrate by a depth of 2 micrometers upon the formation of the pattern by vaporization of the resist layer using the UV laser.

Example 3

3 g of acryl resin (E 2823, made by Elvacite) was dissolved in 1 g of toluene and 0.5 g of butyl acetate to prepare a coating solution for spin coating of a resist layer. The coating solution spin coated onto a glass substrate at 500 rpm to form a resist layer having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the conductive ink composition prepared in Preparation Example 3 was filled in the fine pattern using screen printing, followed by drying at 150° C. for two minutes. A thickness of the conductive patterns was 5 micrometers. After that, the blackening solution composition prepared in Preparation Example 4 was filled on the conductive pattern using screen printing to form an upper blackened layer with a thickness of 1 micrometer, followed by calcination at 600° C. The material remained as the resist layer was vaporized upon the calcination at 600° C., thereby capable of obtaining blackened conductive fine patterns by only washing using toluene.

Example 4

3 g of acryl resin (E 2823, made by Elvacite) was dissolved in 1 g of toluene and 0.2 g of butyl acetate to prepare an ink for screen printing of a resist layer. The ink was screen printed onto a glass substrate to form a resist layer pattern having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the blackening solution composition prepared in Preparation Example 4 was filled in the fine pattern using screen printing, followed by drying at 200° C. to form a lower blackened layer with a thickness of 1 micrometer. Next, the conductive ink composition prepared in Preparation Example 3 was filled in the fine pattern formed with the lower blackened layer using screen printing, followed by drying at 150° C. for two minutes. A thickness of the conductive patterns was 5 micrometers. After that, the blackening solution composition prepared in Preparation Example 4 was filled in using screen printing to form an upper blackened layer with a thickness of 1 micrometer, followed by calcination at 600° C. The material remained as the resist layer was vaporized upon the calcination at 600° C., thereby capable of obtaining blackened conductive fine patterns by only washing using toluene.

Example 5

3 g of acryl resin 2823, made by Elvacite) was dissolved in 1 g of toluene and 0.2 g of butyl acetate to prepare a coating solution for screen printing of a resist layer. The coating solution was screen printed onto a glass substrate to form a resist layer pattern having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the blackening solution composition prepared in Preparation Example 4 was spin coated at 2500 rpm for 20 seconds to fill in the fine pattern, followed by drying at 200° C. to form a lower blackened layer with a thickness of 1 micrometer. Next, the conductive ink composition prepared in Preparation Example 3 was spin coated at 2500 rpm for 20 seconds to fill in the fine pattern, followed by drying at 150° C. for two minutes. A thickness of the conductive patterns was 5 micrometers. After that, the formed fine pattern was dipped in strong hydrochloric acid (35%) for one minute, and then dipped in a copper plating solution [a solution prepared in 1 L by mixing copper sulfate hydrate (180 g), sulfuric acid (27 g) and ion exchanged water].

In this copper plating solution, an electrolytic copper electrode is dipped, followed by black copper plating by applying a voltage 3 V for three minutes. A thickness of the black copper plated layer (an upper blackened layer) was 1 micrometer. After that, calcination was performed at 600° C. to remove the residual resist layer material, thereby capable of obtaining blackened conductive fine patterns.

Example 6

3 g of acryl resin (E 2823, made by Elvacite) was dissolved in 1 g of toluene and 0.2 g of butyl acetate to prepare a coating solution for screen printing of a resist layer. The coating solution was screen printed onto a glass substrate to form a resist layer pattern having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the blackening solution composition prepared in Preparation Example 4 was filled in using a bar coater, followed by drying at 200° C. to form a lower blackened layer with a thickness of 1 micrometer.

Next, the conductive ink composition prepared in Preparation Example 3 was filled in the fine pattern using a bar coater, followed by drying at 150° C. for two minutes. A thickness of the conductive patterns was 5 micrometers. After that, the formed fine pattern was dipped in strong hydrochloric acid (35%) for one minute, and then dipped in a copper plating solution [a solution prepared in 1 L by mixing copper sulfate hydrate (180 g), sulfuric acid (27 g) and ion exchanged water]. In this copper plating solution, an electrolytic copper electrode is dipped, followed by black copper plating by applying a voltage 3 V for three minutes. A thickness of the copper layer was 1 micrometer. After that, the copper layer was dipped in a nickel plating solution [a solution prepared in 1 L by mixing nickel sulfate hydrate (75 g), ammonium nickel sulfate (44 g), zinc sulfate (30 g), sodium thiocyanate (20 g) and ion exchanged water]. In this nickel plating solution, an electrolytic nickel electrode is dipped, followed by black nickel plating by applying a voltage 3 V for one minute to form a black nickel layer with a thickness of 1 micrometer on the copper layer. After that, calcination was performed at 600° C. to remove the residual resist layer material, thereby capable of obtaining blackened conductive fine patterns.

Example 7

3 g of acryl resin (E 2823, made by Elvacite) was dissolved in 1 g of toluene and 0.2 g of butyl acetate to prepare a coating solution for screen printing of a resist layer. The coating solution was screen printed onto a glass substrate to form a resist layer pattern having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the blackening solution composition prepared in Preparation Example 4 was spin coated at 2500 rpm for 20 seconds to fill in the fine pattern, followed by drying at 200° C. to form a blackened layer with a thickness of 1 micrometer. Next, the conductive ink composition prepared in Preparation Example 3 was spin coated at 2500 rpm for 20 seconds to fill in the fine pattern, followed by drying at 150° C. for two minutes. A thickness of the conductive patterns was 5 micrometers. After that, the formed fine pattern was black copper plated with an electroless copper plating solution containing 6.3 g/L of copper sulfate, 2.9 g/L of formaldehyde, 15.8 g/L of ethylenediaminetetraacetate (EDTA), 27 g/L of calcium hydroxide and 0.1 g/L of 2,2'-dipyridyl as an additive. A thickness of the copper layer was 1 micrometer. After that, calcination was performed at 600° C. to remove the residual resist layer material, thereby capable of obtaining blackened conductive fine patterns.

Example 8

3 g of acryl resin (E 2823, made by Elvacite) was dissolved in 1 g of toluene and 0.2 g of butyl acetate to prepare a coating solution for screen printing of a resist layer. The coating solution was screen printed onto a glass substrate to form a resist layer pattern having a thickness of 10 micrometers. Next, a region to be formed with blackened conductive patterns was formed on the resist layer pattern using a UV laser (made by UPI tech, product name: Xpress-DP) with a beam diameter of 20 micrometers. A critical dimension of the fine pattern was about 20 micrometers, which is similar to the beam diameter of the laser. Next, the blackening solution composition prepared in Preparation Example 4 was spin coated at 2500 rpm for 20 seconds to fill in the fine pattern, followed by drying at 200° C. to form a blackened layer with a thickness of 1 micrometer. Next, the conductive ink composition prepared in Preparation Example 3 was spin coated at 2500 rpm for 20 seconds to fill in the fine pattern, followed by drying at 150° C. for two minutes. A thickness of the conductive patterns was 5 micrometers. After that, the formed fine pattern was dipped in an aqueous solution of 50 wt % ammonium sulfide to blacken a surface of the fine pattern, followed by calcination of 600° C. The material remained as the resist layer was vaporized upon the calcination at 600° C., thereby capable of obtaining blackened conductive fine patterns by only washing using toluene.

INDUSTRIAL APPLICABILITY

The method for blackening conductive patterns according to the present invention has, unlike the conventional method using chemical etching, advantages that productivity is enhanced as the process steps is simplified, environmental problem such as disposal of an etching solution is not generated as chemical etching is not used, and high resolution patterns with and superior conductivity and blackened degree can be fabricated. Also, it is possible to form not only single layer patterns but also multilayer patterns upon the formation of the patterns.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A method for fabricating conductive patterns on a non-conductive substrate comprising the steps of:
   (i) forming a resist layer on the non-conductive substrate by applying a solution comprising an organic polymer material, toluene and butyl acetate onto the non-conductive substrate;
   (ii) forming a plurality of pattern grooves in the resist layer using a laser beam;
   (iii) forming a single layer comprising a mixture of a conductive material and a blackening material by spin coating, roll coating, spray coating, bar coating, dip coating, flow coating, doctor blade and dispensing, inkjet printing, offset printing, screen printing, pad printing, gravure printing, flexography printing, or stencil printing in the pattern grooves; and
   (iv) removing the resist layer remained on the non-conductive substrate by performing a heat treatment at a temperature of 500 to 650° C. so as to form the conductive patterns,
   wherein the blackening material is a compound selected from the group consisting of a metal oxide, a metal sulfide and an organic metal compound, and the compound contains one or more metal(s) selected from the group consisting of Cu, Zn, Ni, Co, Ti, Mn, Fe, Cr, Nb, Ru, Cd, Ge and Sn,
   wherein the conductive material and the blackening material are mixed together before filling the mixture in the pattern grooves to form the single layer, and
   wherein the conductive material comprises silver and the conductive material comprises both (1) a metal complex containing silver and (2) metal nanoparticles produced by reacting the metal complex with a reducing agent.

2. The method as set forth in claim 1, wherein the single layer is formed by mixing a conductive ink containing the conductive material and the blackening material and filling the mixture in the pattern grooves.

3. The method as set forth in claim 1, wherein, in the step (ii), the pattern grooves are formed by removing the resist layer and some of the substrate.

4. The method as set forth in claim 3, wherein a depth of the substrate removed in the step (ii) and a height of the single layer containing the conductive material and the blackening material formed in the step (iii) are equal to each other.

5. The method as set forth in claim 1, wherein the conductive material includes the metal nanoparticles prepared by the following fabrication method:
   a) forming the metal complex by reacting a silver compound represented by the formula 1 below with one or a mixture of two or more compounds selected from the group consisting of the compounds represented by formulas 2 to 4 below; and
   b) preparing the metal nanoparticles by reducing the metal complex prepared in the step a) by reacting the metal complex with a reducing agent,

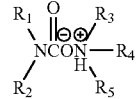
[Formula 1]

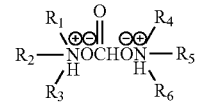
[Formula 2]

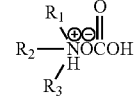
[Formula 3]

[Formula 4]

wherein, in the formulas 1 to 4, X is a substituent selected from the group consisting of oxygen, sulfur, halogen, cyano, cyanate, carbonate, nitrate, nitrite, sulfate, phosphate, thiocyanate, chlorate, perchlorate, tetrafluoroborate, acetylacetonate, carboxylate and derivatives thereof, n is an integer from 1 to 4, and $R_1$ to $R_6$ are independently selected from the group consisting of hydrogen, hydroxyl group, $C_1$-$C_{30}$ alkoxy group, $C_3$-$C_{20}$ aryloxy group, $C_1$-$C_{30}$ aliphatic or $C_3$-$C_{20}$ cycloaliphatic alkyl group or $C_3$-$C_{20}$ aryl or $C_4$-$C_{30}$ aralkyl group as a mixture thereof, substituted $C_1$-$C_{30}$ alkyl group, substituted $C_1$-$C_{20}$ aryl group, substituted $C_4$-$C_{30}$ aralkyl group, $C_3$-$C_{20}$ heterocyclic compound including a heteroatom selected from the group consisting of N, S, O, polymer compound and derivatives thereof, wherein when $R_1$ to $R_6$ are substituted or unsubstituted alkyl group or aralkyl group, alkyl group or aralkyl group may contain a heteroatom selected from the group consisting of N, S, O or an unsaturated bond in the carbon chain, wherein $R_1$ and $R_2$ or $R_4$ and $R_5$, independently, may form an alkylene ring containing or not containing a heteroatom.

6. The method as set forth in claim 1, wherein the organic polymer material is selected from the group consisting of polypropylene, polycarbonate, polyacrylate, polymethylmethacrylate, cellulose acetate, polyvinyl chloride, polyurethane, polyester, alkyd resin, epoxy resin, melamine resin, phenol resin, phenol modified alkyd resin, epoxy modified alkyd resin, vinyl modified alkyd resin, silicone modified alkyd resin, acrylic melamine resin, polyisocyanate resin and epoxy ester resin.

7. A method for fabricating conductive patterns on a non-conductive substrate comprising the steps of:
   (i) forming a resist layer on the non-conductive substrate by applying a solution comprising an organic polymer material, toluene and butyl acetate onto the non-conductive substrate;
   (ii) forming a plurality of pattern grooves in the resist layer using a laser beam;
   (iii) forming a stacked three-layer comprising a mixture of a conductive material and a blackening material by spin coating, roll coating, spray coating, bar coating, dip coating, flow coating, doctor blade and dispensing, inkjet printing, offset printing, screen printing, pad printing, gravure printing, flexography printing, or stencil printing in the pattern grooves; and (iv) removing the resist layer remained on the non-conductive substrate by performing a heat treatment at a temperature of 500 to 650° C. so as to form the conductive patterns, wherein the blackening material is a compound selected from the group consisting of a metal oxide, a metal sulfide and an organic metal compound, and the compound contains one or more metal(s) selected from the group consisting of Cu, Zn, Ni, Co, Ti, Mn, Fe, Cr, Nb, Ru, Cd, Ge and Sn, wherein to form the stacked three-layer the conductive material and the blackening material of the stacked three-layer are structured so that the blackening material completely surrounds the conductive material, and wherein the conductive material comprises silver and the conductive material comprises both (1) a metal complex containing silver and (2) metal nanoparticles produced by reacting the metal complex with a reducing agent.

8. The method as set forth in claim 7, wherein the stacked three-layer is formed by filling and drying a blackening solution containing the blackening material in the pattern grooves, so as to form a first layer, and filling and drying a conductive ink containing the conductive material in the pattern grooves on top of the first layer, so as to form a second layer and then forming a third layer containing the blackening material on top of the second layer.

9. The method as set forth in claim 8, wherein the third layer is formed by filling and drying the blackening solution containing the blackening material in the pattern grooves on top of the second layer.

10. The method as set forth in claim 8, wherein the third layer is formed by electroplating or electroless plating the blackening material onto the second layer.

11. The method as set forth in claim 8, wherein the third layer is formed by dipping the second layer formed in the pattern grooves in the blackening solution containing the blackening material to blacken a surface of the second layer.

12. A method for fabricating conductive patterns on a non-conductive substrate comprising the steps of:
(i) forming a resist layer on the non-conductive substrate by applying a solution comprising an organic polymer material, toluene and butyl acetate onto the non-conductive substrate;
(ii) forming a plurality of pattern grooves in the resist layer using a laser beam;
(iii) forming a stacked two-layer comprising a mixture of a conductive material and a blackening material by spin coating, roll coating, spray coating, bar coating, dip coating, flow coating, doctor blade and dispensing, inkjet printing, offset printing, screen printing, pad printing, gravure printing, flexography printing, or stencil printing in the pattern grooves; and
(iv) removing the resist layer remained on the non-conductive substrate by performing a heat treatment at a temperature of 500 to 650° C. so as to form the conductive patterns, wherein the blackening material is a compound selected from the group consisting of a metal oxide, a metal sulfide and an organic metal compound, and the compound contains one or more metal(s) selected from the group consisting of Cu, Zn, Ni, Co, Ti, Mn, Fe, Cr, Nb, Ru, Cd, Ge and Sn, wherein the stacked two-layer is formed by filling and drying a conductive ink containing the conductive material in the pattern grooves, so as to form a first layer, and then forming an upper blackened layer containing the blackening material on top of the first layer, wherein a filling thickness of the dried conductive ink comprises 1-80% of a height of the pattern grooves and a filling thickness of the upper blackened layer being formed is 1-50% of the height of the pattern grooves, and wherein the conductive material comprises silver and the conductive material comprises both (1) a metal complex containing silver and (2) metal nanoparticles produced by reacting the metal complex with a reducing agent.

13. The method as set forth in claim 12, wherein the upper blackened layer is formed by filling and drying a blackening solution containing the blackening material in the pattern grooves on top of the first layer.

14. The method as set forth in claim 12, wherein the upper blackened layer is formed by electroplating or electroless plating the blackening material onto the first layer.

15. The method as set forth in claim 12, wherein the upper blackened layer is formed by dipping the first layer formed in the pattern grooves in a blackening-solution containing the blackening material to blacken a surface of the first layer.

* * * * *